US010761558B1

(12) United States Patent
Hao et al.

(10) Patent No.: US 10,761,558 B1
(45) Date of Patent: Sep. 1, 2020

(54) CLOCK FAIL DETECTOR

(71) Applicant: Artery Technology Co., Ltd., Chongqing (CN)

(72) Inventors: Baotian Hao, Chongqing (CN); Weitie Wang, Chongqing (CN); Chao Li, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/810,854

(22) Filed: Mar. 6, 2020

(30) Foreign Application Priority Data

Nov. 1, 2019 (CN) .......................... 2019 1 1060317

(51) Int. Cl.
*G06F 1/06* (2006.01)
*H03K 5/24* (2006.01)
*G01R 19/165* (2006.01)
*G06F 1/14* (2006.01)
*G11C 27/02* (2006.01)

(52) U.S. Cl.
CPC ......... *G06F 1/06* (2013.01); *G01R 19/16528* (2013.01); *G06F 1/14* (2013.01); *G11C 27/02* (2013.01); *H03K 5/24* (2013.01)

(58) Field of Classification Search
None
See application file for complete search history.

(56) References Cited

U.S. PATENT DOCUMENTS

| 3,440,617 A * | 4/1969 | Lesti .................... G06K 9/32 382/224 |
| 2014/0118043 A1* | 5/2014 | Thiagarajan .......... H03K 5/156 327/175 |
| 2016/0305997 A1* | 10/2016 | Wiesbauer ............... G01D 5/24 |

* cited by examiner

*Primary Examiner* — Lincoln D Donovan
*Assistant Examiner* — Khareem E Almo
(74) *Attorney, Agent, or Firm* — Winston Hsu

(57) ABSTRACT

A clock fail detector is provided. The clock fail detector includes a timing control signal generator and a clock fail detection module, which may generate control signals according to a clock signal and perform clock fail detection according to the control signals, respectively. The clock fail detection module may comprise first integrators, sample and hold circuits, a second integrator and a comparator. The first integrator may convert previous periods of the clock signal into reference voltages according to ping pong mode control signals within the control signals, respectively. The sample and hold circuits may sample and hold the reference voltages according to the ping pong mode control signals. The second integrator may convert a current clock period of the clock signal into a ramp signal. The comparator may compare the ramp signal with a reference voltage to generate a comparison result signal for indicating whether the clock signal is normal.

16 Claims, 8 Drawing Sheets

CLOCK FAIL DETECTOR

BACKGROUND OF THE INVENTION

1. Field of the Invention

The present invention is related to electronic circuits, and more particularly, to a clock fail detector.

2. Description of the Prior Art

A clock fail detector is an important basic circuit in an electronic device. A conventional clock fail detector has some problems; in particular, a response time of the clock fail detector (e.g. a delay time of a pulse representing clock fail to a time point of the clock fail occurring) is typically equal to a constant value rather than being related to clock periods, which may be inconvenient for performing fail processing of the electronic device. For example, as the input clock gets quicker, the aforementioned response time cannot be reduced at the same time, and as the input clock gets slower, the aforementioned response time cannot be increased accordingly. In addition, the aforementioned response time is typically sensitive to process variations, which may cause inaccuracy of operations of the electronic device, making the overall performance worse. Thus, there is a need for a clock fail detector with a novel architecture to improve the overall performance of an electronic system.

SUMMARY OF THE INVENTION

An objective of the present invention is to provide a clock fail detector which can solve the aforementioned problems.

Another objective of the present invention is to provide a clock fail detector which can achieve optimal performance of an electronic device.

Yet another objective of the present invention is to provide a clock fail detector which can achieve higher precision with respect to process variations.

At least one embodiment of the present invention provides a clock fail detector. The clock fail detector may comprise a timing control signal generator and at least one clock fail detection module coupled to the timing control signal generator. The timing control signal generator may be arranged to receive a clock signal, and generate multiple control signals according to the clock signal, to perform timing control for the clock fail detector. The at least one clock fail detection module may be arranged to perform clock fail detection according to the multiple control signals. More particularly, the clock fail detection module may comprise multiple first integrators and multiple sample and hold circuits operating in a ping pong mode, which are respectively coupled to the timing control signal generator and the multiple first integrators, and may comprise at least one second integrator coupled to the timing control signal generator and at least one comparator coupled to the multiple sample and hold circuits and the second integrator. The multiple first integrators may be arranged to convert multiple previous clock periods of the clock signal into multiple reference voltages according to multiple respective ping pong mode control signals within the multiple control signals; the multiple sample and hold circuits may be arranged to sample and hold the multiple reference voltages according to the multiple respective ping pong mode control signals for comparison; the at least one second integrator may be arranged to convert at least one current clock period of the clock signal into at least one ramp signal for comparison; and the at least one comparator may be arranged to compare the at least one ramp signal with at least one reference voltage within the multiple reference voltages, to generate at least one comparison result signal for indicating whether the clock signal is normal.

In comparison with a conventional clock fail detector, the clock fail detector of the present invention has higher precision with respect to process variations (e.g. a response time of fail detection thereof is not sensitive to process variations), to thereby make an electronic device achieve optimal performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
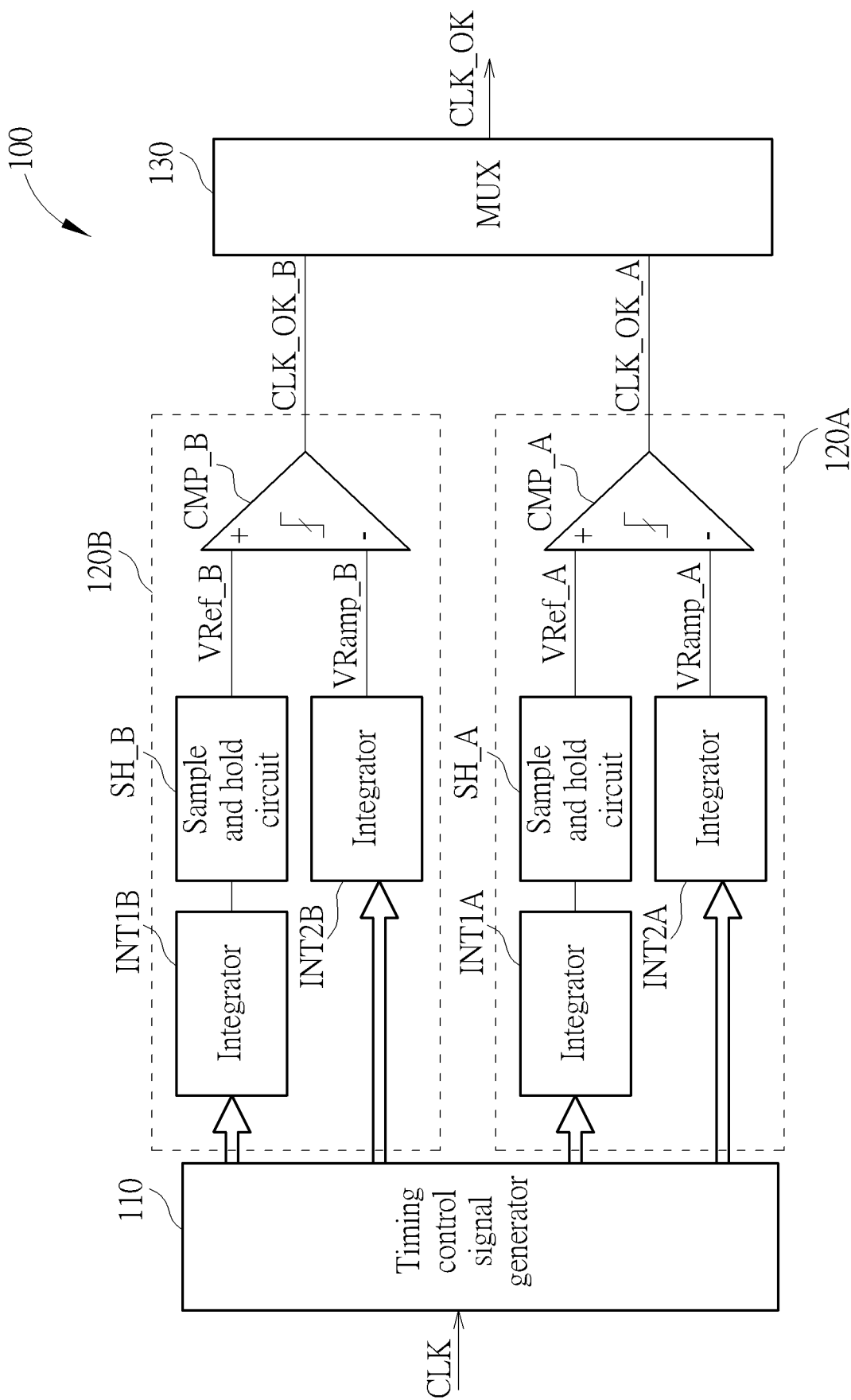
FIG. 1 is a diagram illustrating a clock fail detector according to an embodiment of the present invention.

FIG. 1 is a diagram illustrating a clock fail detector 100 according to an embodiment of the present invention. The clock fail detector 100 may comprise a timing control signal generator 110, and at least one clock fail detection module coupled to the timing control signal generator 110, such as clock fail detection modules 120A and 120B. The timing control signal generator 110 may be arranged to receive a clock signal CLK, and generate multiple control signals according to the clock signal CLK, to perform timing control for the clock fail detector 100. The at least one clock fail detection module such as the clock fail detection modules 120A and 120B may be arranged to perform clock fail detection according to the multiple control signals. More particularly, the aforementioned at least one clock fail detection module (such as the clock fail detection modules 120A and 120B) may comprise multiple first integrators and multiple sample and hold circuits operating in a ping pong mode, such as first integrators INT1A and INT1B coupled to the timing control signal generator 110 and sample and hold circuits SH_A and SH_B respectively coupled to the first integrators INT1A and INT1B, and may comprise at least one second integrator coupled to the timing control signal generator 110, such as second integrators INT2A and INT2B, and may further comprise at least one comparator coupled to the multiple sample and hold circuits and the at least one second integrator, such as comparators CMP_A and CMP_B coupled to the sample and hold circuits SH_A and SH_B and the second integrators INT2A and INT2B.

According to this embodiment, the first integrators INT1A and INT1B may convert multiple previous clock periods of the clock signal CLK into multiple reference voltages such as reference voltages VRef_A and VRef_B according to multiple respective ping pong mode control signals within the multiple control signals, and the sample and hold circuits SH_A and SH_B may sample and hold the reference voltages VRef_A and VRef_B according to the multiple respective ping pong mode control signals for comparison. In addition, the at least one second integrator such as the integrators INT2A and INT2B may convert at least one current clock period of the clock signal CLK (e.g. one or more current clock periods, such as respective latest clock periods at different time points) into at least one ramp signal such as ramp signals VRamp_A and VRamp_B for comparison. In addition, the at least one comparator such as the comparators CMP_A and CMP_B may compare the at least one ramp signal such as the ramp signals VRamp_A and VRamp_B with at least one reference voltage within the reference voltages VRef_A and VRef_B, to generate at least one comparison result signal, and more particularly, may compare the ramp signals VRamp_A and VRamp_B with the reference voltages VRef_A and VRef_B, respectively, to generate comparison result signals CLK_OK_A and CLK_OK_B, for indicating whether the clock signal CLK is normal. As shown in FIG. 1, the clock fail detector 100 may further comprise a multiplexer 130 (which is labeled "MUX" in FIG. 1 for brevity). Based on the ping pong mode, the multiplexer 130 may select one of the comparison result signals CLK_OK_A and CLK_OK_B respectively generated by the comparators CMP_A and CMP_B to act as a comparison result signal CLK_OK to be outputted, and more particularly, selects the comparison result signals CLK_OK_A and CLK_OK_B by turns to act as the comparison result signal CLK_OK for indicating whether the clock signal CLK is normal. For better comprehension, when the clock signal CLK is in a normal state (e.g. clock periods of the clock signal CLK are unchanged), the clock fail detector 100 may control the comparison result signal CLK_OK to be maintained at a predetermined voltage level, for indicating the clock signal CLK is normal; otherwise, under a condition where the clock signal CLK is in an abnormal state (e.g. clock periods of the clock signal CLK are changed), the clock fail detector 100 may control the comparison result signal CLK_OK to switch to another predetermined voltage level to form a pulse representing clock fail, for indicating that the clock signal is abnormal; but the present invention is not limited thereto.

According to some embodiments, switching components (e.g. switches) within the architecture shown in FIG. 1 may be implemented by adopting some types of Metal Oxide Semiconductor Field Effect Transistors (MOSFETs) such as a P-type MOSFET and an N-type MOSFET, but the present invention is not limited thereto.

Figure 2:
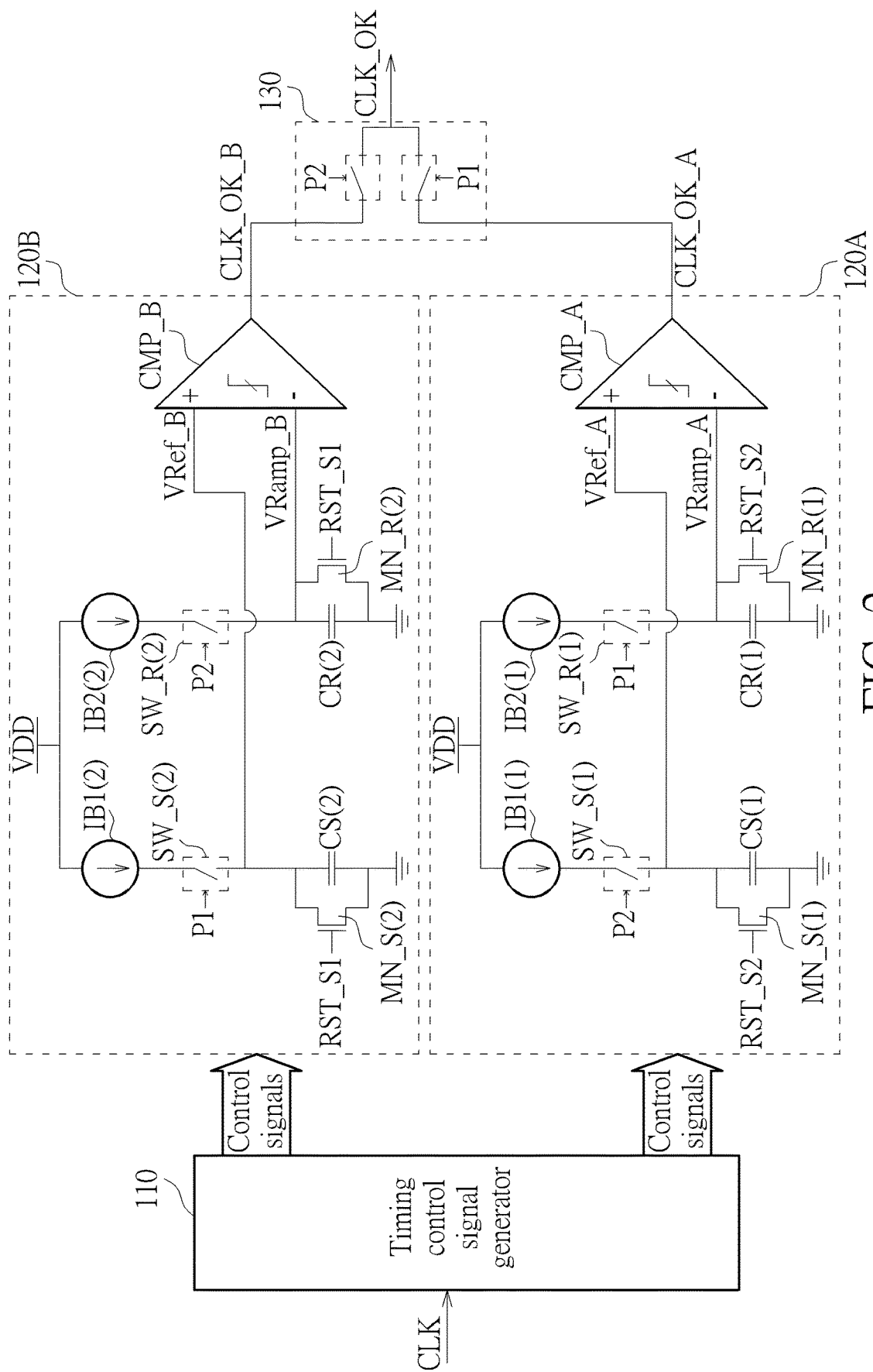
FIG. 2 illustrates a detailed implementation of the clock fail detector shown in FIG. 1 according to an embodiment of the present invention.

FIG. 2 illustrates a detailed implementation of the clock fail detector 100 shown in FIG. 1 according to an embodiment of the present invention, where the sample and hold circuits SH_A and SH_B may be integrated into the first integrators INT1A and INT1B, respectively, but the present invention is not limited thereto. In the clock fail detection module 120A, the first integrator INT1A may comprise a current source IB1(1) coupled to a power voltage VDD, a switch SW_S(1) coupled to the current source IB1(1), and a capacitor CS(1) and a transistor MN_S(1) coupled between the switch SW_S(1) and a ground voltage (which is represented by a ground symbol), the sample and hold circuit SH_A may comprise the switch SW_S(1), the capacitor CS(1) and the transistor MN_S(1), and the second integrator INT2A may comprise a current source IB2(1) coupled to the power voltage VDD, a switch SW_R(1) coupled to the current source IB2(1), and a capacitor CR(1) and a transistor MN_R(1) coupled between the switch SW_R(1) and the ground voltage. Similarly, in the clock fail detection module 120B, the first integrator INT1B may comprise a current source IB1(2) coupled to the power voltage VDD, a switch SW_S(2) coupled to the current source IB1(2), and a capacitor CS (2) and a transistor MN_S(2) coupled between the switch SW_S(2) and the ground voltage. The sample and hold circuit SH_B may comprise the switch SW_S(2), the capacitor CS(2) and the transistor MN_S(2), and the second integrator INT2B may comprise a current source IB2(2) coupled to the power voltage VDD, a switch SW_R(2) coupled to the current source IB2(2), and a capacitor CR(2) and a transistor MN_R(2) coupled between the switch SW_R(2) and the ground voltage.

As shown in FIG. 2, the multiple control signals may comprise ping pong mode control signals P1 and P2 and reset signals RST_S1 and RST_S2, where the ping pong mode control signals P1 and P2 may be examples of the multiple ping pong mode control signals. The clock fail detection modules 120A and 120B may perform operations of the ping pong mode to generate the comparison result signals CLK_OK_A and CLK_OK_B according to the ping pong mode control signals P1 and P2 and the reset signals RST_S1 and RST_S2, and output the comparison result signals CLK_OK_A and CLK_OK_B to the multiplexer 130 for being selected to act as the comparison result signal CLK_OK by turns. In addition, the multiplexer 130 may comprise a set of switches respectively receiving the ping pong mode control signals P1 and P2, and this set of switches may select the comparison result signals CLK_OK_A and CLK_OK_B to act as the comparison result signal CLK_OK to be outputted by turns according to the ping pong mode control signals P1 and P2. For brevity, similar descriptions of this embodiment are not repeated in detail.

Figure 3:
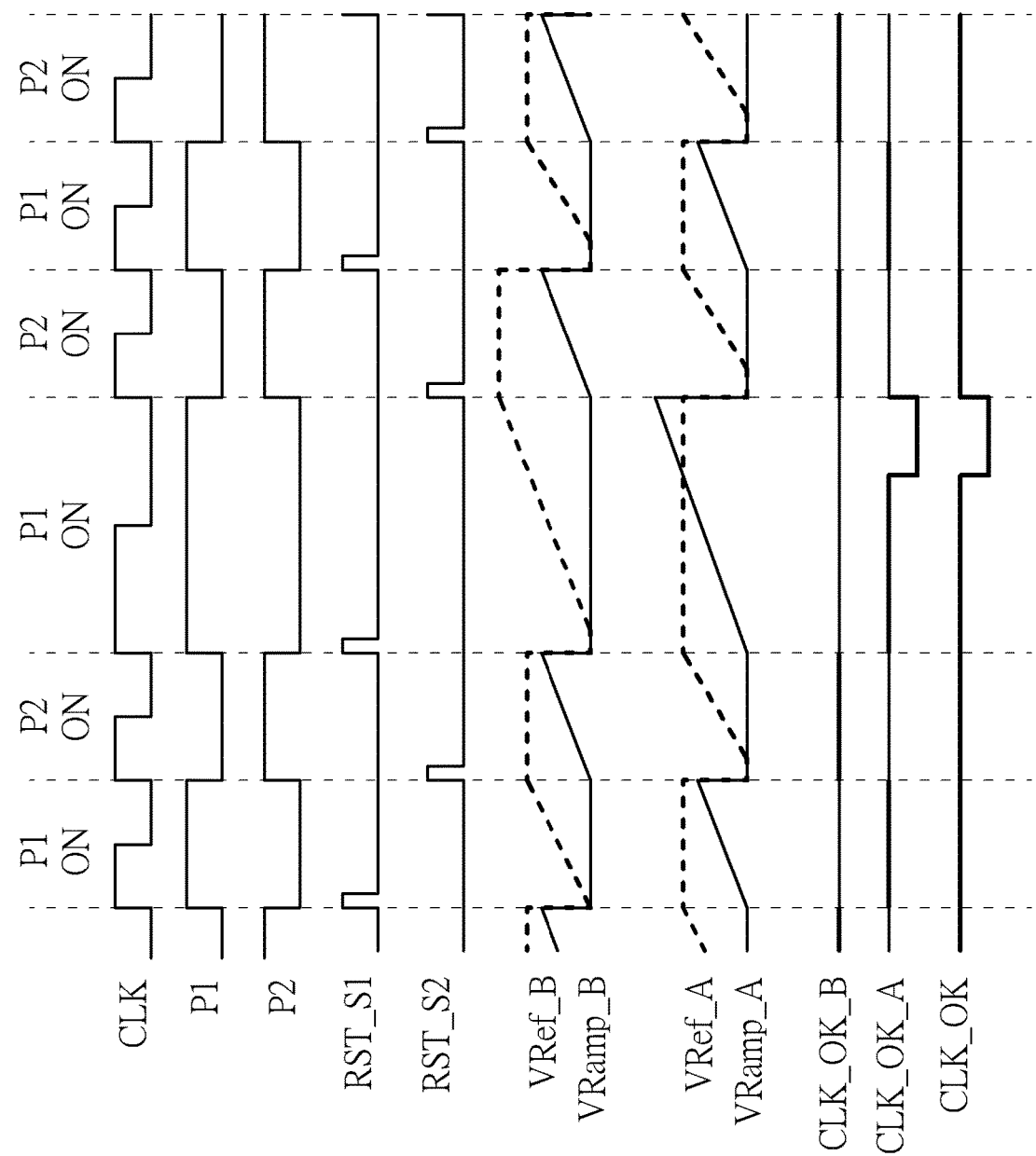
FIG. 3 illustrates associated signals of the clock fail detector shown in FIG. 1 according to an embodiment of the present invention.

FIG. 3 illustrates associated signals of the clock fail detector 100 shown in FIG. 1 according to an embodiment of the present invention. The periods of the ping pong mode control signals P1 and P2 may be twice the period of the clock signal CLK, and the ping pong mode control signals P1 and P2 may be turn on states (respectively labeled "P1 ON" and "P2 ON" for brevity), to alternately turn on or turn off corresponding switches within the clock fail detector 100.

Regarding the clock fail detection module 120A, according to the ping pong mode control signal P2, the switch SW_S(1) may control the current source IB1(1) to charge the capacitor CS(1) to generate the reference voltage VRef_A in a period of the clock signal CLK (e.g. one of the multiple previous clock periods, such as the first "P2 ON" period in FIG. 3), and control the capacitor CS(1) to hold the reference voltage VRef_A in another period of the clock signal CLK (e.g. one of the multiple current clock periods, such as one of the respective latest clock periods at the different time points; taking FIG. 3 as an example, the second "P1 ON" period), and more particularly, to hold the reference voltage VRef_A at the charged voltage level for comparison. In addition, according to the ping pong mode control signal P1, the switch SW_R(1) may control the current source IB2(1) to charge the capacitor CR(1) to generate the ramp signal VRamp_A in a period of the clock signal CLK (e.g. the one of the multiple current clock periods, such as the one of the respective latest clock periods at the different time points; taking FIG. 3 as an example, the second "P1 ON" period), and control the capacitor CR(1) to hold the ramp signal VRamp_A at the reset voltage level in another period of the clock signal CLK (e.g. a next period of the one of the multiple current clock periods, such as the second "P2 ON" period in FIG. 3) for further monitoring.

Regarding the clock fail detection module 120B, according to the ping pong mode control signal P1, the switch SW_S(2) may control the current source IB1(2) to charge the capacitor CS(2) to generate the reference voltage VRef_B in a period of the clock signal CLK (e.g. another one of the multiple previous clock periods, such as the first "P1 ON" period in FIG. 3), and control the capacitor CS(2) to hold the reference voltage VRef_B in another period of the clock signal CLK (e.g. another one of the multiple current clock periods, such as another one of the respective latest clock periods at the different time points; taking FIG. 3 as an example, the first "P2 ON" period), and more particularly, to hold the reference voltage VRef_B at the charged voltage level for comparison. In addition, according to the ping pong mode control signal P2, the switch SW_R(2) may control the current source IB2(2) to charge the capacitor CR(2) to generate the ramp signal VRamp_B in a period of the clock signal CLK (e.g. the other one of the multiple current clock periods, such as the other one of the respective latest clock periods at the different time points; taking FIG. 3 as an example, the first "P2 ON" period), and control the capacitor CR(2) to hold the ramp signal VRamp_B at the reset voltage level in another period of the clock signal CLK (e.g. a next period of the other one of the multiple current clock periods, such as the second "P1 ON" period in FIG. 3) for further monitoring.

According to this embodiment, the at least one second integrator such as the second integrators INT2A and INT2B may comprise at least one switch receiving at least one reset signal within the multiple control signals, such as the transistors MN_R(1) and MN_R(2); more particularly, the transistors MN_R(1) and MN_R(2) may reset the second integrators INT2A and INT2B according to the at least one reset signal such as the reset signals RST_S2 and RST_S1, respectively, to allow the clock fail detector 100 to monitor the at least one current clock period indicated by the at least one ramp signal through the at least one second integrator such as the second integrators INT2A and INT2B. In addition, a sample and hold circuit within the sample and hold circuits SH_A and SH_B may comprise a switch receiving a reset signal within the multiple control signals, such as any one of the transistors MN_S(1) and MN_S(2); more particularly, the transistors MN_S(1) and MN_S(2) may reset the sample and hold circuits SH_A and SH_B according to the reset signals RST_S2 and RST_S1, respectively, to allow the clock fail detector 100 to monitor the multiple previous clock periods indicated by the reference voltages VRef_A and VRef_B through the sample and hold circuits SH_A and SH_B. For brevity, similar descriptions of this embodiment are not repeated in detail.

Figure 4:
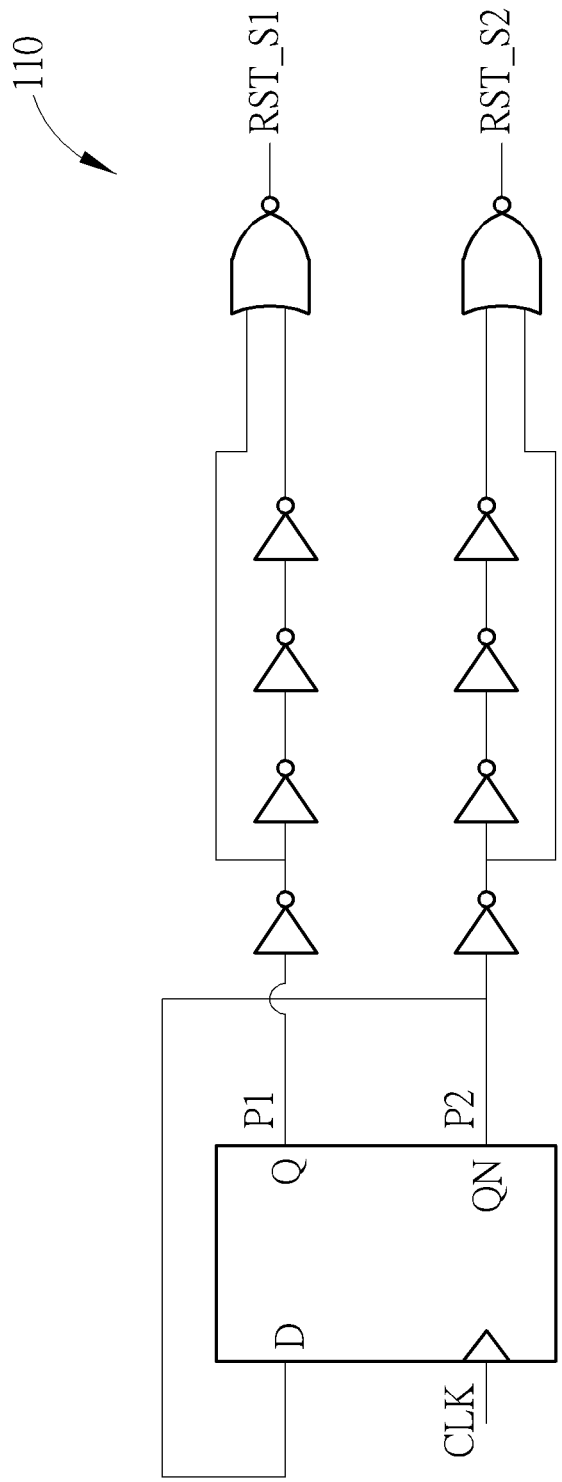
FIG. 4 illustrates a detailed implementation of a timing control signal generator within the clock fail detector shown in FIG. 1 according to an embodiment of the present invention.

FIG. 4 illustrates a detailed implementation of the timing control signal generator 110 within the clock fail detector 100 shown in FIG. 1 according to an embodiment of the present invention. The timing control signal generator 110 may comprise a flip-flop receiving the clock signal CLK, such as a D-type flip-flop, and comprise two sets of inverters coupled to multiple output terminals of the flip-flop (e.g. terminals Q and QN of the D-type flip-flop) and two NOR gates respectively coupled to these two sets of inverters, where the terminal QN of the D-type flip-flop may also be labeled "Q", i.e. with an added horizontal line above "Q" (Q-bar). An input terminal and a clock terminal of the flip-flop (e.g. a terminal D and a clock terminal of the D-type flip-flop) are coupled to one of the multiple output terminals (e.g. the terminal Q of the D-type flip-flop) and the clock signal CLK, respectively. As shown in FIG. 4, the ping pong mode control signal P1 and P2 may be obtained from the terminals Q and QN of the D-type flip-flop, respectively, and the reset signals RST_S1 and RST_S2 may be obtained from respective output terminals of these two NOR gates. For brevity, similar descriptions of this embodiment are not repeated in detail.

Figure 5:
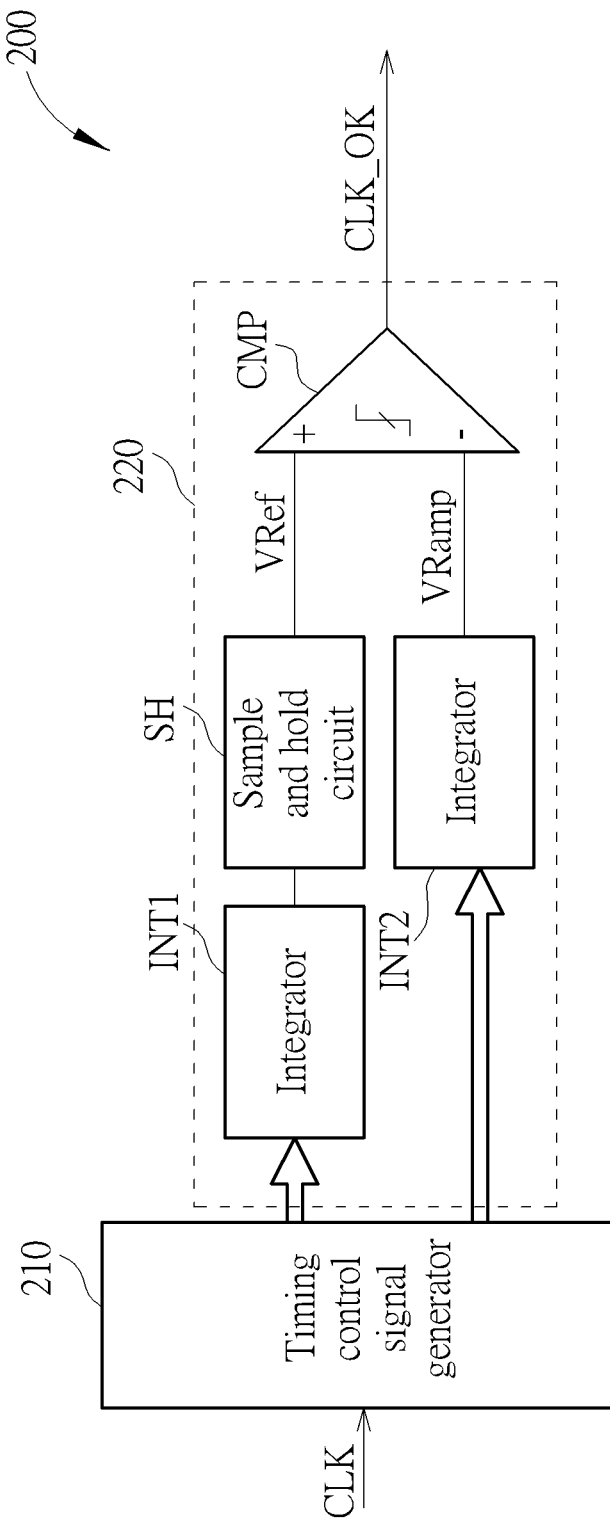
FIG. 5 is a diagram illustrating a clock fail detector according to an embodiment of the present invention.

FIG. 5 is a diagram illustrating a clock fail detector 200 according to an embodiment of the present invention. The clock fail detector 200 may comprise a timing control signal generator 210, and at least one clock fail detection module coupled to the timing control signal generator 210, such as a clock fail detection module 220. In comparison with the architecture shown in FIG. 1, the at least one clock fail detection terminal may be implemented as an integrated clock fail detection module such as the clock fail detection module 220; more particularly, the clock fail detection modules 120A and 120B, preferably in conjunction with the multiplexer 130, may be integrated into this integrated clock fail detection module, and the timing control signal generator 110 may be correspondingly modified as the clock control signal generator 210. For example, the multiple first integrators such as the first integrators INT1A and INT1B may share at least one component to form an integrated first integrator such as a first integrator INT1, and associated circuits within the at least one clock fail detection module may be correspondingly modified, where the multiple sample and hold circuits may be implemented as a sample and hold circuit SH, the at least one second integrator may comprise a single second integrator such as a second integrator INT2, and the at least one comparator may comprise a single comparator such as a comparator CMP, but the present invention is not limited thereto. For brevity, similar descriptions of this embodiment are not repeated in detail.

According to some embodiments, the sample and hold circuits SH_A and SH_B may be integrated into the first integrators INT1A and INT1B, respectively; more particularly, the clock fail detection modules 120A and 120B respectively comprising the first integrators INT1A and INT1B, preferably in conjunction with the multiplexer 130, may be integrated into the integrated clock fail detection module such as the clock fail detection module 220, but the present invention is not limited thereto.

Figure 6:
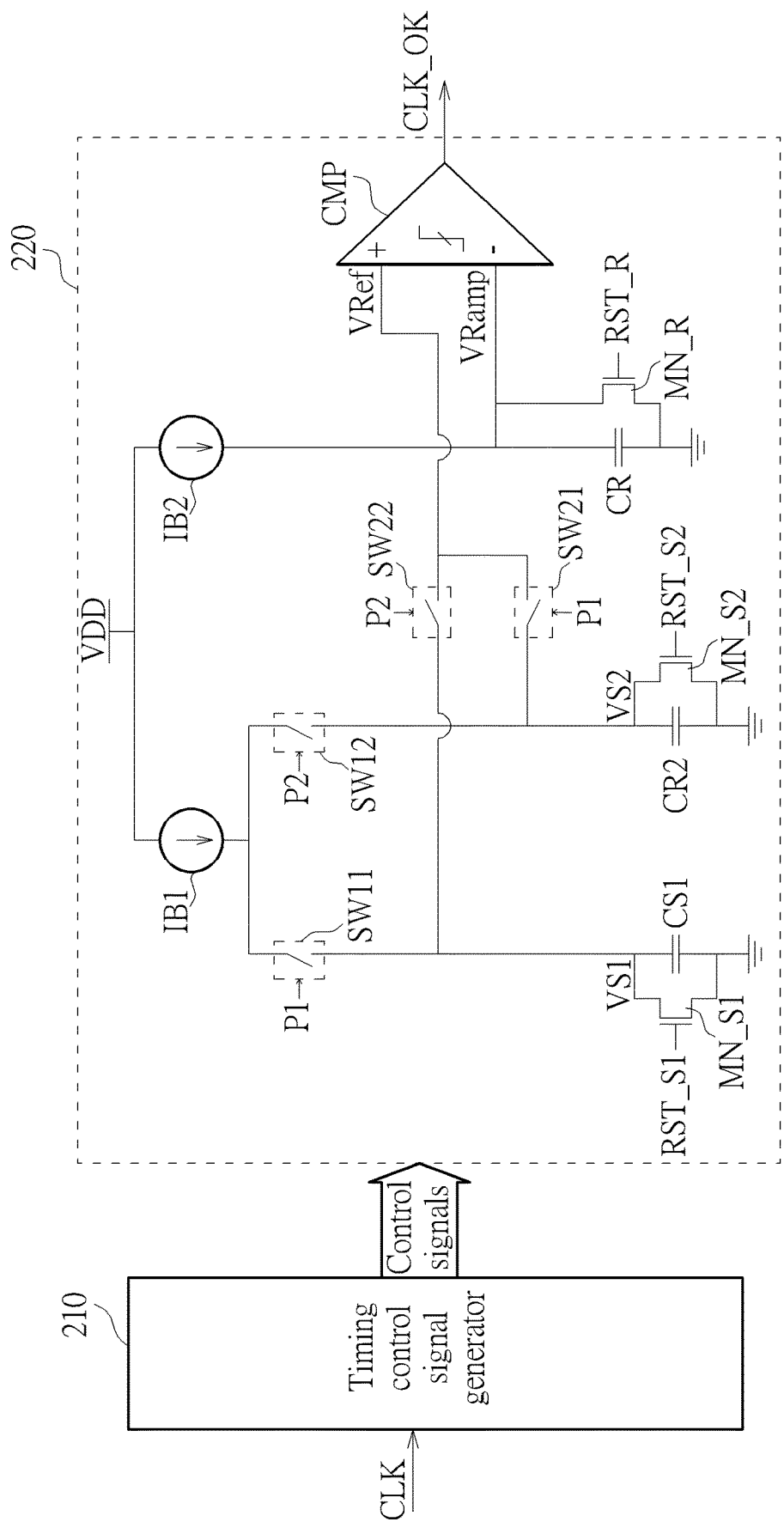
FIG. 6 illustrates a detailed implementation of the clock fail detector shown in FIG. 5 according to an embodiment of the present invention.

FIG. 6 illustrates a detailed implementation of the clock fail detector 200 shown in FIG. 5 according to an embodiment of the present invention, where the sample and hold circuit SH may be integrated into the first integrator INT1, but the present invention is not limited thereto. In comparison with the architecture shown in FIG. 2, the clock fail detection modules 120A and 120B, preferably in conjunction with the multiplexer 130, may be integrated into the integrated clock fail detection module such as the clock fail detection module 220. More particularly, in this integrated architecture, a sub-circuit corresponding to the first integrator INT1A in the integrator INT1 may comprise a current source IB1 coupled to the power voltage VDD, a switch SW12 coupled to the current source IB1, and a capacitor CS2 and a transistor MN_S2 (which receives the reset signal RST_S2) coupled between the switch SW12 and the ground voltage (which is represented by a ground symbol), and this sub-circuit may replace the first integrator INT1A; and a sub-circuit corresponding to the sample and hold circuit SH_A in the sample and hold circuit SH may comprise the switch SW12, the capacitor CS2 and the transistor MN_S2 receiving the reset signal RST_S2, and this sub-circuit may replace the sample and hold circuit SH_A. Similarly, in this integrated architecture, a sub-circuit corresponding to the first integrator INT1B in the integrator INT1 may comprise the current source IB1 coupled to the power voltage VDD, a switch SW11 coupled to the current source IB1, and a capacitor CS1 and a transistor MN_S1 (which receives the rest signal RST_S1) coupled between the switch SW11 and the ground voltage, and this sub-circuit may replace the first integrator INT1B; and a sub-circuit corresponding to the sample and hold circuit SH_B in the sample and hold circuit SH may comprise the switch SW11, the capacitor CS1 and the transistor MN_S1 receiving the reset signal RST_S1, and this sub-circuit may replace the sample and hold circuit SH_B. Accordingly, the reference voltage VS2 and VS1 may replace the reference voltage VRef_A and VRef_B, respectively.

In addition, regarding the multiplexer 130 being integrated into the integrated clock fail detection module such as the clock fail detection module 220, the clock fail detection module 220 may comprise a multiplexer such as the multiplexer 130. More particularly, this multiplexer may comprise a set of switches SW21 and SW22 respectively receiving the ping pong mode control signals P1 and P2, and may select one of the multiple reference voltages (such as one of the reference voltages VS2 and VS1) based on the ping pong mode to act as a reference voltage VRef to be compared, for being outputted to the single comparator such as the comparator CMP, where the set of switches SW21 and SW22 may select the reference voltages VS2 and VS1 by turns to act as the reference voltage VRef to be compared according to the ping pong mode control signals P1 and P2. In addition, in this integrated architecture, a sub-circuit corresponding to the second integrator INT2A and INT2B in the second integrator INT2 may comprise a current source IB2 coupled to the power voltage VDD, and a capacitor CR and a transistor MN_R (which receives a reset signal RST_R) coupled between the current source IB2 and the ground voltage, and this sub-circuit may replace the second integrators INT2A and INT2B. Accordingly, a ramp signal VRamp may replace the ramp signals VRamp_A and VRamp_B.

As shown in FIG. 6, the multiple control signals may comprise the ping pong mode control signals P1 and P2 and rest signals RST_S1, RST_S2 and RST_R. The clock fail detection module 220 may perform operations related to the ping pong mode according to the ping pong mode control signals P1 and P2 and rest signals RST_S1, RST_S2 and RST_R to generate the comparison result signal CLK_OK. For brevity, similar descriptions of this embodiment are not repeated in detail.

Figure 7:
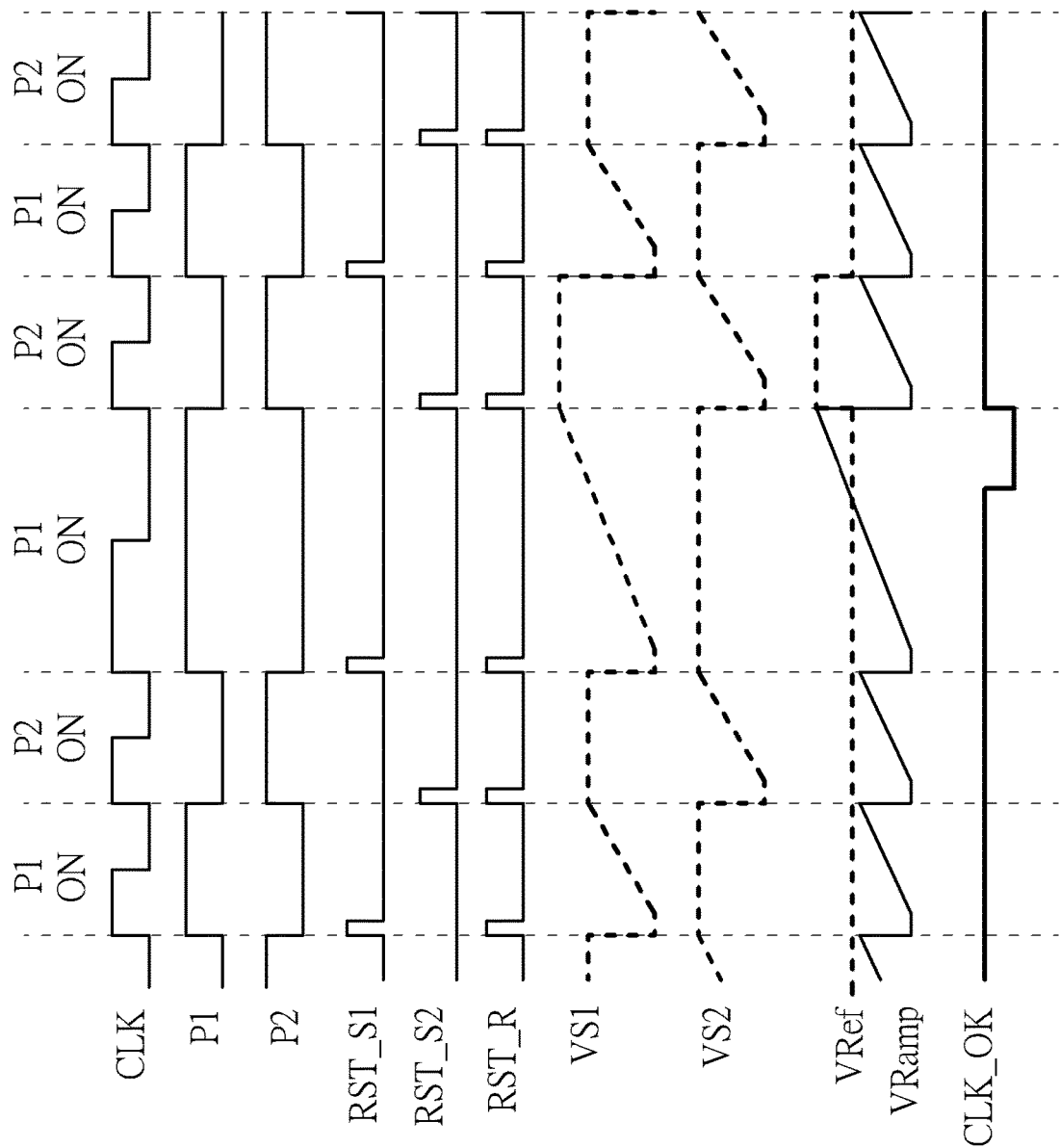
FIG. 7 illustrates associated signals of the clock fail detector shown in FIG. 5 according to an embodiment of the present invention.

FIG. 7 illustrates associated signals of the clock fail detector 200 shown in FIG. 5 according to an embodiment of the present invention. In comparison with the embodiment shown in FIG. 3, the multiple control signals may comprise the ping pong mode control signals P1 and P2 and rest signals RST_S1, RST_S2 and RST_R. In addition, the reference voltages VS2 and VS1 may replace VRef_A and VRef_B, respectively, and the ramp signal VRamp may replace the ramp signals VRamp_A and VRamp_B, where the switches SW21 and SW22 may select the reference voltages VS2 and VS1 by turns to act as the reference voltage VRef to be compared according to the ping pong mode control signals P1 and P2. For brevity, similar descriptions of this embodiment are not repeated in detail.

Figure 8:
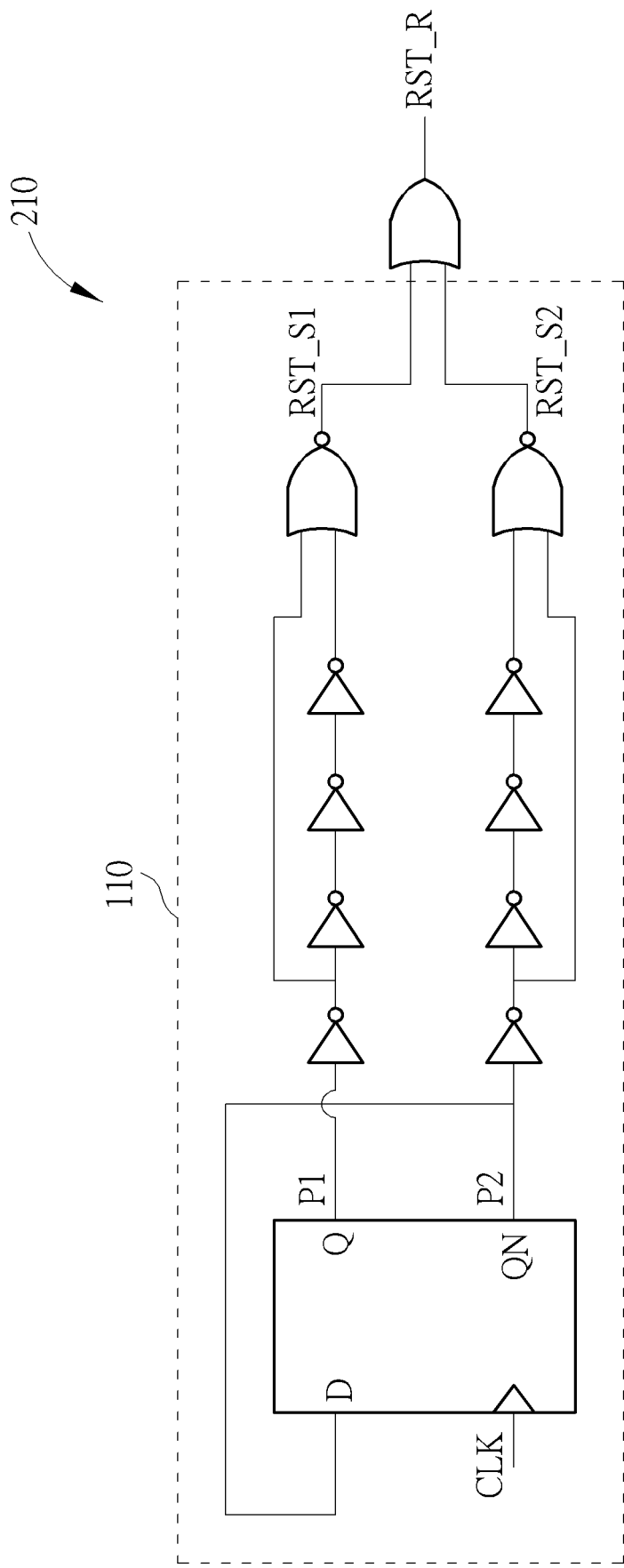
FIG. 8 illustrates a detailed implementation of a timing control signal generator within the clock fail detector shown in FIG. 5 according to an embodiment of the present invention.

FIG. 8 illustrates a detailed implementation of the timing control signal generator 210 within the clock fail detector 200 shown in FIG. 5 according to an embodiment of the present invention. In comparison with the architecture shown in FIG. 4, the timing control signal generator 210 may comprise the timing control signal generator 110, and more particularly, components therein (e.g. the flip-flop such as the D-type flip-flop, the two sets of inverters and the two NOR gates), and comprise an OR gate coupled to the timing control signal generator 110, where multiple input terminals of this OR gate are coupled to the respective output terminals of the two NOR gate, respectively, and the reset signal RST_R may be obtained from an output terminal of this OR gate. For brevity, similar descriptions of this embodiment are not repeated in detail.

According to some embodiments, when the multiple previous clock periods of the clock signal CLK represent a normal period of the clock signal CLK (e.g. a fixed time length), based on the ping pong mode, a response time of the clock fail detector of the present invention (e.g. the clock fail detectors 100 and 200) regarding the clock signal CLK losing the normal period may be less than or equal to the normal period. For brevity, similar descriptions of this embodiment are not repeated in detail.

According to some embodiments, any first integrator within the multiple first integrators is implemented by a first capacitor charged with a first current source (e.g. the capacitor CS(1) charged with the current source IB1(1), the capacitor CS(2) charged with the current source IB1(2), the capacitor CS1 charged with the current source IB1, and the capacitor CS2 charged with the current source IB1), and any second integrator within the at least one second integrator is implemented by a second capacitor charged with a second current source (e.g. the capacitor CR(1) charged with the current source IB2(1), the capacitor CR(2) charged with the current source IB2(2), and the capacitor CR charged with the current source IB2), where respective currents of the first current and the second current are equal to a first current value and a second current value, respectively, and respective capacitances of the first capacitor and the second capacitor are equal to a first capacitance and a second capacitance. More particularly, the response time of the clock fail detector of the present invention (e.g. the clock fail detectors 100 and 200) regarding the clock signal CLK losing the normal period (e.g. the fixed time length) may be associated with a ratio of the first current value to the second current value and a ratio of the first capacitance to the second capacitance. For example, under a condition where the first current value, the second current value, the first capacitance and the second capacitance have been determined, the response time is not sensitive to process variations. For brevity, similar descriptions of this embodiment are not repeated in detail.

According to some embodiments, the first current value, the second current value, the first capacitance and the second capacitance may be configured in advance to determine the response time, but the present invention is not limited thereto. For brevity, similar descriptions of this embodiment are not repeated in detail.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock fail detector, comprising:
   a timing control signal generator, arranged to receive a clock signal and generate multiple control signals according to the clock signal, to perform timing control for the clock fail detector; and
   at least one clock fail detection module, coupled to the timing control signal generator, arranged to perform clock fail detection according to the multiple control signals, wherein the at least one clock fail detection module comprises:
      multiple first integrators operating in a ping pong mode, the multiple first integrators being coupled to the timing control signal generator, arranged to convert multiple previous clock periods of the clock signal into multiple reference voltages according to multiple ping pong mode control signals within the multiple control signals, respectively;
      multiple sample and hold circuits operating in the ping pong mode, the multiple sample and hold circuits being coupled to the multiple first integrators, arranged to sample and hold the multiple reference voltages according to the multiple ping pong mode control signals, respectively, for comparison;
      at least one second integrator coupled to the timing control signal generator, arranged to convert at least one current clock period of the clock signal into at least one ramp signal for comparison; and
      at least one comparator coupled to the multiple sample and hold circuits and the at least one second integrator, arranged to compare the at least one ramp signal with at least one reference voltage within the multiple reference voltages, to generate at least one comparison result signal for indicating whether the clock signal is normal.

2. The clock fail detector of claim 1, wherein the multiple sample and hold circuits are integrated into the multiple first integrators, respectively.

3. The clock fail detector of claim 1, wherein the at least one second integrator comprises multiple second integrators, and the at least one comparator comprises multiple comparators; the at least one clock fail detection module comprises multiple clock fail detection modules, wherein any clock fail detection module within the multiple clock fail detection modules comprises one of the multiple first integrators, one of the multiple sample and hold circuits, one of the multiple second integrators and one of the multiple comparators; and the clock fail detector further comprises:
   a multiplexer, arranged to select one of multiple comparison result signals respectively generated by the multiple comparators based on the ping pong mode to act as a comparison result signal to be outputted, for indicating whether the clock signal is normal.

4. The clock fail detector of claim 3, wherein the multiplexer comprises:
   a set of switches respectively receiving the multiple ping pong mode control signals, arranged to select the multiple comparison result signals by turns to act as the comparison result signal to be outputted according to the multiple ping pong mode control signals.

5. The clock fail detector of claim 3, wherein the multiple sample and hold circuits are integrated into the multiple first integrators, respectively, wherein:
   said one of the multiple first integrators comprises:
      a current source, coupled to a power voltage;
      a switch, coupled to the current source; and
      a capacitor, coupled between the switch and a ground voltage; and
   said one of the multiple sample and hold circuits comprises:
      the switch; and
      the capacitor.

6. The clock fail detector of claim 5, wherein according to one of the multiple ping pong mode control signals, the switch controls the current source to charge the capacitor in a period of the clock signal to generate one of the multiple reference voltages, and controls the capacitor to hold the one of the multiple reference voltages in another period of the clock signal.

7. The clock fail detector of claim 1, wherein the at least one second integrator comprises a single second integrator, and the at least one comparator comprises a single comparator; the at least one clock fail detection module is implemented as an integrated clock fail detection module, wherein the multiple first integrators share at least one component; and the integrated clock fail detection module further comprises:
   a multiplexer, arranged to select one of the multiple reference voltages based on the ping pong mode to act as a reference voltage to be compared, for being outputted to the single comparator.

8. The clock fail detector of claim 7, wherein the multiplexer comprises:
   a set of switches respectively receiving the multiple ping pong mode control signals, arranged to select the multiple reference voltages by turns to act as the reference voltage to be compared according to the multiple ping pong mode control signals.

9. The clock fail detector of claim 7, wherein the multiple sample and hold circuits are integrated into the multiple first integrators, respectively, wherein:
   one of the multiple first integrators comprises:
      a current source, coupled to a power voltage, wherein the at least one component shared by the multiple first integrators comprises the current source;
      a switch, coupled to the current source; and
      a capacitor, coupled between the switch and a ground voltage; and
   one of the multiple sample and hold circuits comprises:
      the switch; and
      the capacitor.

10. The clock fail detector of claim 9, wherein according to one of the multiple ping pong mode control signals, the switch controls the current source to charge the capacitor in a period of the clock signal to generate one of the multiple reference voltages, and controls the capacitor to hold the one of the multiple reference voltages in another period of the clock signal.

11. The clock fail detector of claim 1, wherein the at least one second integrator comprises:
   at least one switch receiving at least one reset signal within the multiple control signals, arranged to reset the at least one second integrator according to the at least one reset signal, to allow the clock fail detector to monitor the at least one current clock period indicated by the at least one ramp signal through the at least one second integrator.

12. The clock fail detector of claim 1, wherein a sample and hold circuit within the multiple sample and hold circuits comprises:

a switch receiving a reset signal within the multiple control signals, arranged to reset the sample and hold circuit according to the reset signal, to allow the clock fail detector to monitor the multiple previous clock periods indicated by the multiple reference voltages through the multiple sample and hold circuits.

13. The clock fail detector of claim 1, wherein when the multiple previous clock periods of the clock signal represent a normal period of the clock signal, based on the ping pong mode, a response time of the clock fail detector regarding the clock signal losing the normal period is less than or equal to the normal period.

14. The clock fail detector of claim 1, wherein any first integrator within the multiple first integrators is implemented by a first capacitor charged with a first current source, and any second integrator within the at least one second integrator is implemented by a second capacitor charge with a second current source, wherein respective currents of the first current source and the second current source are equal to a first current value and a second current value, respectively, and respective capacitances of the first capacitor and the second capacitor are equal to a first capacitance and a second capacitance, respectively; and a response time of the clock fail detector regarding the clock signal losing a normal period is associated with a ratio of the first current value to the second current value and a ratio of the first capacitance to the second capacitance.

15. The clock fail detector of claim 14, wherein under a condition where the first current value, the second current value, the first capacitance and the second capacitance have been determined, the response time is not sensitive to process variations.

16. The clock fail detector of claim 14, wherein the first current value, the second current value, the first capacitance and the second capacitance are configured in advance to determine the response time.

* * * * *